United States Patent
Lin

(10) Patent No.: US 7,138,881 B2
(45) Date of Patent: Nov. 21, 2006

(54) FAST WAKE-UP CRYSTAL OSCILLATING CIRCUIT

(75) Inventor: Meng-Chih Lin, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 79 days.

(21) Appl. No.: 10/990,471

(22) Filed: Nov. 18, 2004

(65) Prior Publication Data

US 2005/0151596 A1   Jul. 14, 2005

(30) Foreign Application Priority Data

Jan. 9, 2004   (TW) ............................... 93100600 A

(51) Int. Cl.
*H03B 5/32* (2006.01)
(52) U.S. Cl. .................. 331/158; 331/116 R; 331/175
(58) Field of Classification Search ................ 331/160, 331/174, 175, 116 R, 158
See application file for complete search history.

(56) References Cited

U.S. PATENT DOCUMENTS 6,819,196 B1 * 11/2004 Lovelace et al. ........... 331/183

2005/0017812 A1 * 1/2005 Ashida et al. .............. 331/158

* cited by examiner

*Primary Examiner*—Joseph Chang
*Assistant Examiner*—Levi Gannon
(74) *Attorney, Agent, or Firm*—Bacon & Thomas, PLLC

(57) ABSTRACT

A fast wake-up crystal oscillating circuit includes: a crystal oscillator for generating oscillation signal, an amplifier set, a feedback resistor, first and second triggers and an amplifier switch logic. The amplifier set amplifies the oscillation signal. The feedback resistor supplies DC operation bias to the amplifier set. The first trigger has an input connected to the output of the amplifier set so that the first trigger is triggered by the amplified oscillation signal to generate a first clock. The second trigger has an input connected the output of the amplifier set so that the second trigger is triggered by the amplified oscillation signal to generate a second clock, wherein the second trigger has a hysteresis voltage higher than a predetermined value. The amplifier switch logic is connected to the second trigger to gradually decrease the amplification of the amplifier set when detecting that the second trigger generates the second clock.

10 Claims, 3 Drawing Sheets

FAST WAKE-UP CRYSTAL OSCILLATING CIRCUIT

BACKGROUND OF THE INVENTION

1. Field of the Invention

The present invention relates to a crystal oscillating circuit, and more particularly to a fast wake-up crystal oscillating circuit capable of assuring successful oscillation.

2. Description of Related Art

FIG. 1 shows a conventional crystal oscillating circuit comprising an inverting amplifier 11, a feedback resistor 12, a crystal oscillator 13, a pair of capacitors 14 and a Schmitt trigger 16. The inverting amplifier 11 is employed for signal amplification to provide a gain for the crystal oscillating circuit. The Schmitt trigger 16 is triggered by an amplified signal generated by the inverting amplifier 11 to output a clock signal CLK. The feedback resistor 12 supplies a DC operation bias to the inverting amplifier 11. The crystal oscillator 13 generates an oscillation signal having a resonance frequency. The pair of capacitors 14 causes the crystal oscillating circuit to have a parallel resonance very close to a series resonance while the oscillation frequency of the crystal oscillating circuit is between the parallel resonance and the series resonance.

For the aforesaid crystal oscillating circuit, the signal bandwidth and amplification gain vary with operation voltage, processing parameters and load capacitor pair. In practical applications, these variations may cause difficulty or even failure for the crystal oscillating circuit to wake up.

To solve the above-mentioned problems, the prior art provided an improved crystal oscillating circuit as shown in FIG. 2, which utilizes a number of parallel inverting amplifiers 11 to achieve the object to fast wake up the crystal oscillating circuit. FIG. 3 shows the switching operation of the inverting amplifiers 11 of FIG. 2. First, all the inverting amplifiers 11 are turned on when a power supply is applied (step S301) (known as "strong mode"). In the strong mode, the amplification gain of the amplifiers 11 is very high so that the object to fast wake up the crystal oscillating circuit can be achieved. However, the current consumed by the amplifiers at that time is also high. To save the power consumption, the clock CLK so generated is applied to an N-bit counter 17 (step S302). After $2^N$ clocks, the counter 17 stops counting, remaining only a basic inverting amplifier 11 for keeping the crystal oscillating circuit to oscillate (known as "weak mode"), while the other inverting amplifiers 11 are turned off (step S303).

The aforesaid improved crystal oscillating circuit enables fast wake-up by connecting plural inverting amplifiers in parallel. However, after wake-up, only one basic inverting amplifier 11 is retained, and thus the wake-up crystal oscillating circuit also encounters the same problem as the conventional crystal oscillating circuit in that the crystal oscillating circuit may fail to wake up due to operation voltage, processing parameter and load capacitor variations. Therefore, it is desirable to provide an improved crystal oscillating circuit to mitigate and/or obviate the aforementioned problems.

SUMMARY OF THE INVENTION

It is therefore an object of the present invention to provide a fast wake-up crystal oscillating circuit capable of assuring successful oscillation without being influenced by the manufacturing process, load capacitor and power supply variations.

It is another object of the present invention to provide a fast wake-up crystal oscillating circuit capable of effectively reducing the wake-up time.

It is a further object of the present invention to provide a fast wake-up crystal oscillating circuit capable of automatically adjusting the current consumed at the minimum.

It is still a further object of the present invention to provide a fast wake-up crystal oscillating circuit capable of replacing crystals having different frequencies without causing a failure to oscillation or a significant current consumption problem.

To attain the aforesaid objects, there is provided a fast wake-up crystal oscillating circuit, which comprises: a crystal oscillator for generating an oscillation signal; an amplifier set for amplifying the oscillation signal and generating an amplified oscillation signal at its output terminal so that the amplifier set has a maximum amplification when a power supply is applied; a feedback resistor connected in parallel with the amplifier set for supplying a DC operation bias to the amplifier set; a first trigger having an input terminal connected to the output terminal of the amplifier set so that the first trigger is triggered by the amplified oscillation signal to generate a first clock output; a second trigger having an input terminal connected the output terminal of the amplifier set so that the second trigger is triggered by the amplified oscillation signal to generate a second clock output, wherein the second trigger has a hysteresis voltage higher than a predetermined value; and an amplifier switch logic connected to the second trigger to gradually decrease the amplification of the amplifier set when detecting that the second trigger generates the second clock output.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
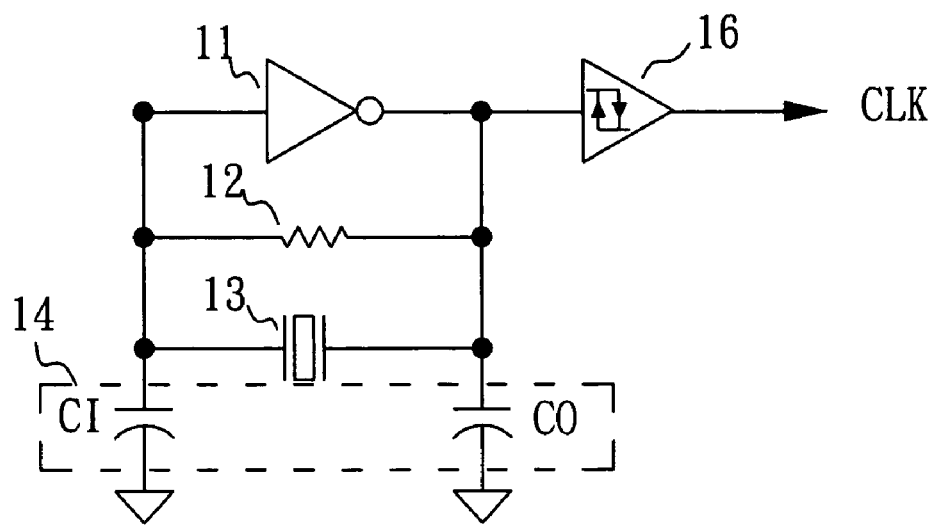
FIG. 1 shows a conventional crystal oscillating circuit.
Figure 2:
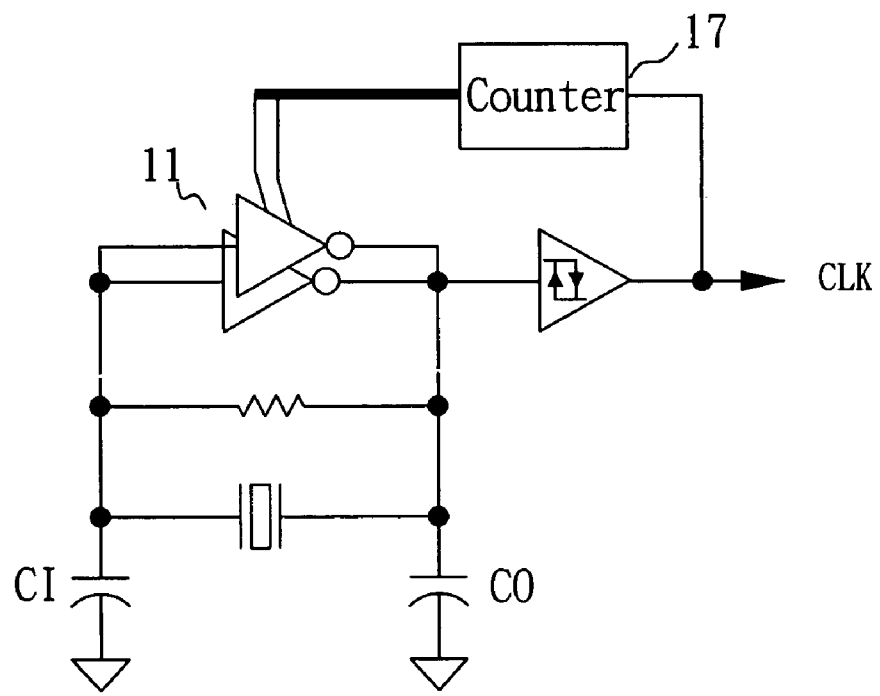
FIG. 2 shows an improved crystal oscillating circuit.
Figure 3:
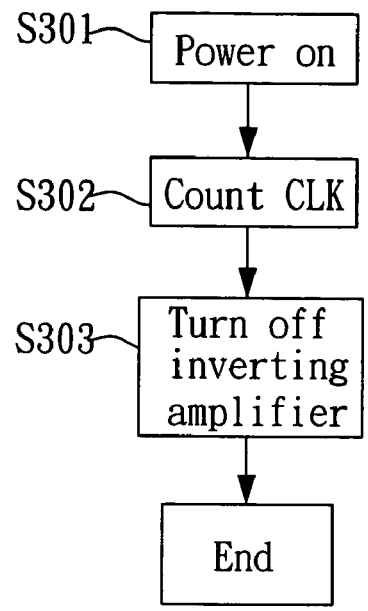
FIG. 3 shows the switching process of the inverting amplifiers of the improved crystal oscillating circuit.
Figure 4:
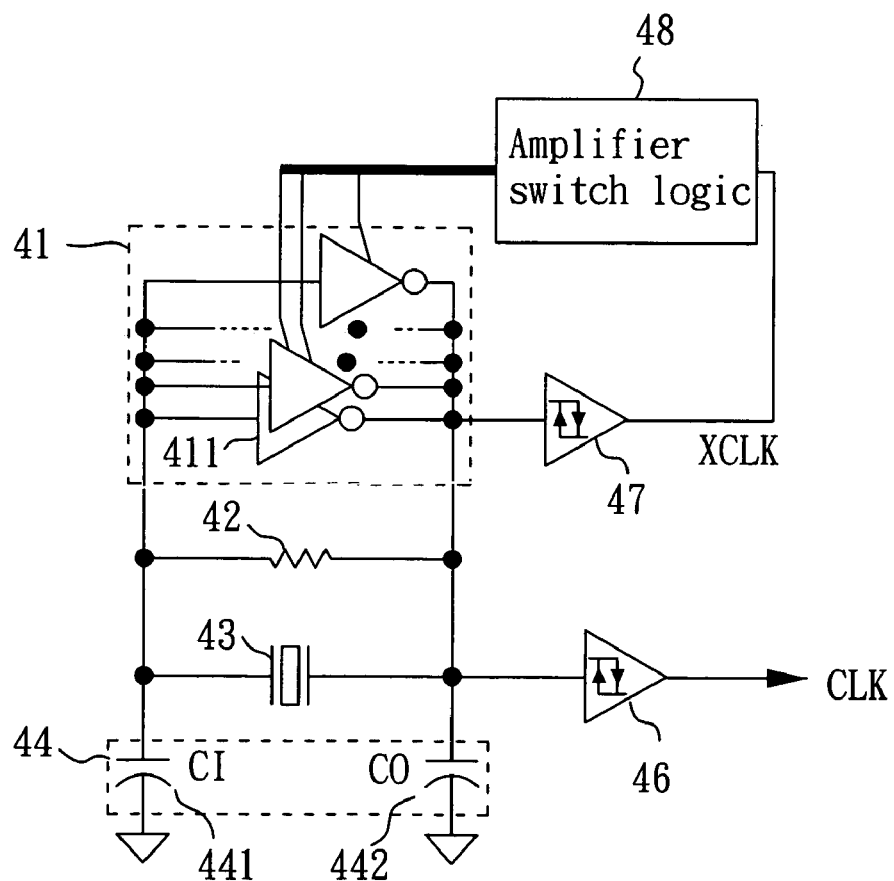
FIG. 4 is an embodiment of a fast wake-up crystal oscillating circuit in accordance with the present invention.

FIG. 4 is an embodiment of a fast wake-up crystal oscillating circuit in accordance with the present invention. The fast wake-up crystal oscillating circuit comprises an amplifier set 41, a feedback resistor 42, a crystal oscillator 43, a pair of capacitors 44, a first trigger 46, a second trigger 47 and an amplifier switch logic 48. The amplifier set 41 includes a number of amplifiers 411 connected in parallel for amplifying a signal to provide a gain for the crystal oscillating circuit. Preferably, the amplifiers 411 are inverting amplifiers. The feedback resistor 42 is connected in parallel with the amplifier set 41 for supplying a DC operation bias to the amplifier set 41. The crystal oscillator 43 is connected in parallel with the feedback resistor 42 and the amplifier set 41 to generate an oscillation signal having a resonance frequency. The pair of capacitors 44 has capacitors 411 and 412 respectively connected to the two terminals of the crystal oscillator 43 to cause the gain of the crystal oscillating circuit to have a parallel resonance very close to a series resonance while the oscillation frequency of the crystal oscillating circuit is between the parallel resonance and the series resonance.

The first trigger 46 is a small-swing Schmitt trigger having a lower hysteresis voltage and its input terminal is connected to the output terminal of the amplifier set 41, so that the first trigger 46 is triggered by the amplified signal outputted from the amplifier set 41 to generate a clock output CLK. The small-swing Schmitt trigger can be replaced with a typical inverting amplifier. The second trigger 47 is a large-swing Schmitt trigger having a higher hysteresis voltage and its input terminal is connected to the output terminal of the amplifier set 41 for detecting the amplitude of the amplified signal outputted from the amplifier sets 41. When the amplitude of the amplified signal is higher than the hysteresis voltage of the second trigger 47, an enhanced clock output XCLK is generated for being fed to the amplifier switch logic 48.

Figure 5:
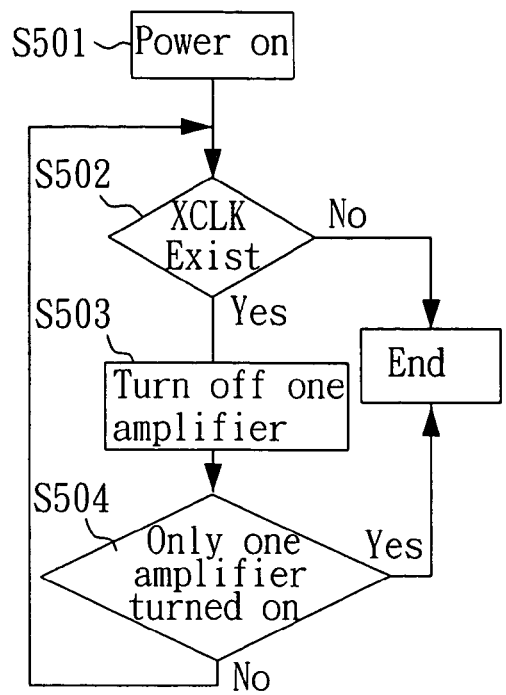
FIG. 5 shows the switching process of inverting amplifiers of a fast wake-up crystal oscillating circuit in accordance with the present invention.

The amplifier switch logic 48 adjusts the number of the inverting amplifiers being turned on, so as to save the current consumed. FIG. 5 shows the switching process of the amplifier switch logic 48. At first, when power supply is applied, all the inverting amplifiers of the amplifier set 41 are turned on (step S501). Hence, the crystal oscillating circuit wakes up quickly. As such, the power consumption is greatly increased because all the amplifiers 411 are turned on. To prevent the crystal oscillating circuit from oscillation stoppage after wake-up due to turning off the amplifiers 411 at one time, when the enhanced clock output XCLK is generated by the second trigger 47 (step S502), the amplification of the amplifier set 41 is gradually reduced by the amplifier switch logic 48 (step S503). That is, the amplifiers 411 of the amplifier set 41 are turned off one by one until the second trigger 47 does not generate enhanced clock output XCLK or the amplifier set 41 has only one amplifier 411 turned on (step S504).

In the switching process, when the enhanced clock output XCLK is disappeared, it indicates that the amplification of the amplifier set 41 is decreased so that the second trigger 47 is unable to generate the enhanced clock output XCLK. However, since the second trigger 47 is a large-swing Schmitt trigger having a hysteresis voltage higher than that of the first trigger 46, the amplification of the amplifier set 41 is still sufficient for the first trigger 46 to generate the clock output CLK. Thus, oscillation of the crystal oscillating circuit can be assured after the inverting amplifiers are turned off to save the current consumed.

The amplifier switch logic 48 can be an N-bit counter for counting the number of clocks of the enhanced clock output XCLK. When the counter completes counting, one inverting amplifier of the amplifier set 41 is turned off. Then, the counter is reset to start to count from the beginning.

Figure 6:
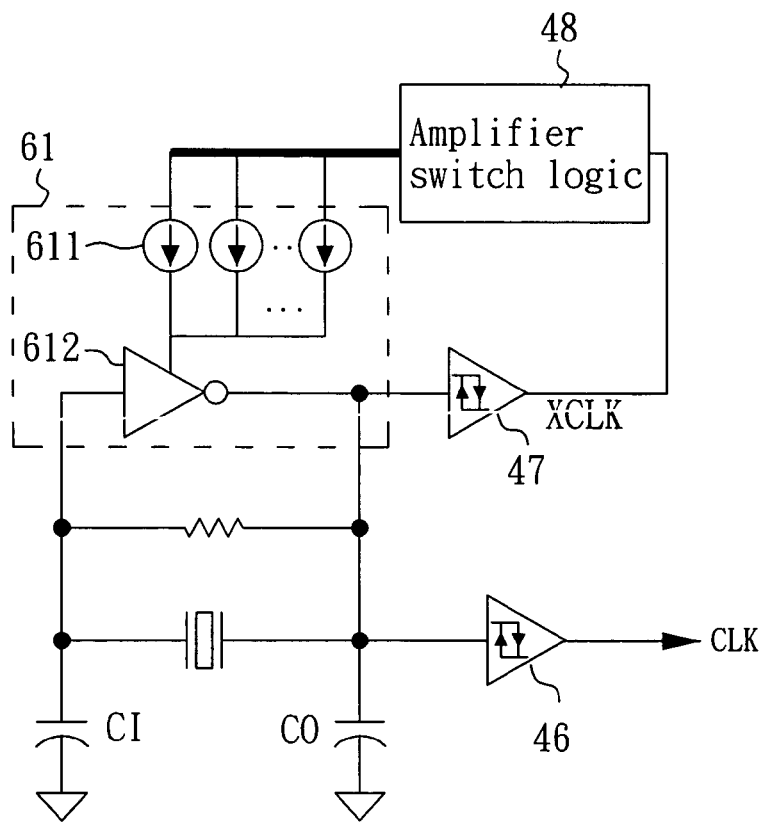
FIG. 6 is another embodiment of a fast wake-up crystal oscillating circuit in accordance with the present invention.

FIG. 6 shows another embodiment of a fast wake-up crystal oscillating circuit according to the present invention, which is similar to the first embodiment except that the amplifier set 61 is constituted by a number of current sources 611 connected in parallel and an amplifier 612 controlled by the current sources. Preferably, the amplifier 612 is a current-controlled inverting amplifier. The amplifier switch logic 48 sequentially turns off the current sources 611 of the amplifier set 61 to achieve the effect of gradually reducing the amplification effect of the amplifier set 61. That is, the current sources 611 of the amplifier set 61 are turned off one by one until the second trigger 47 does not generate enhanced clock output XCLK or the amplifier set 41 has only one current source 611 turned on.

In view of the foregoing, it is known that the crystal oscillating circuit of the present invention enables oscillation by turning on most of the amplifiers at the same time and reducing the amplification of the amplifiers gradually until the large-swing Schmitt trigger does not generate clock signal, which has the following advantages:

1. assuring oscillation of the crystal oscillating circuit without being influenced by the manufacturing process, load capacitor and power supply voltage variations;
2. effectively reducing the wake-up time of the crystal oscillating circuit;
3. automatically adjusting the number of turned-on inverting amplifiers of the crystal oscillating circuit so as to minimize the current consumed; and
4. enabling adaptation to some applications that require replacement of the crystal oscillators having different frequencies.

Although the present invention has been explained in relation to its preferred embodiments, it is to be understood that many other possible modifications and variations can be made without departing from the spirit and scope of the invention as hereinafter claimed.

What is claimed is:

1. A fast wake-up crystal oscillating circuit, comprising:
   a crystal oscillator for generating an oscillation signal;
   an amplifier set for amplifying the oscillation signal and generating an amplified oscillation signal at its output terminal so that the amplifier set has a maximum amplification when a power supply is applied;
   a feedback resistor connected in parallel with the amplifier set for supplying a DC operation bias to the amplifier set;
   a first trigger having an input terminal connected to the output terminal of the amplifier set so that the first trigger is triggered by the amplified oscillation signal to generate a first clock output, wherein the first trigger has a first hysteresis voltage;
   a second trigger having an input terminal connected the output terminal of the amplifier set so that the second trigger is triggered by the amplified oscillation signal to generate a second clock output, wherein the second trigger has a second hysteresis voltage higher than the first hysteresis voltage; and
   an amplifier switch logic connected to the second trigger to gradually decrease the amplification of the amplifier set when detecting that the second trigger generates the second clock output.

2. The fast wake-up crystal oscillating circuit of claim 1, wherein the first trigger is a first Schmitt trigger, and the second trigger is a second Schmitt trigger.

3. The fast wake-up crystal oscillating circuit of claim 1, wherein the first trigger is an inverting amplifier and the second trigger is a Schmitt trigger.

4. The fast wake-up crystal oscillating circuit of claim 2, further comprising a pair of capacitors connected to two terminals of the crystal oscillator respectively.

5. The fast wake-up crystal oscillating circuit of claim 2, wherein the amplifier set includes a number of inverting amplifiers connected in parallel.

6. The fast wake-up crystal oscillating circuit of claim 5, wherein, when the second clock output generated by the second trigger is detected, the amplifier switch logic turns off the inverting amplifiers of the amplifier set one by one until the second trigger does not generate the second clock output or the amplifier set has only one amplifier turned on.

7. The fast wake-up crystal oscillating circuit of claim 6, wherein the amplifier switch logic includes a counter for counting the second clock output, and one inverting amplifier of the amplifier set is turned off when the counter completes counting.

8. The fast wake-up crystal oscillating circuit of claim 2, wherein the amplifier set includes a number of current sources connected in parallel and a current-controlled inverting amplifier controlled by the current sources.

9. The fast wake-up crystal oscillating circuit of claim 8, wherein, when the second clock output generated by the second trigger is detected, the amplifier switch logic turns off the current sources of the amplifier set one by one until the second trigger does not generate the second clock output or the amplifier set has only one current source turned on.

10. The fast wake-up crystal oscillating circuit of claim 9, wherein the amplifier switch logic includes a counter for counting the second clock output, and one current source of the amplifier set is turned off when the counter completes counting.

* * * * *